(12) United States Patent
Brask et al.

(10) Patent No.: US 7,384,880 B2
(45) Date of Patent: Jun. 10, 2008

(54) METHOD FOR MAKING A SEMICONDUCTOR DEVICE HAVING A HIGH-K GATE DIELECTRIC

(75) Inventors: Justin K. Brask, Portland, OR (US);
Jack Kavalieros, Portland, OR (US);
Mark L. Doczy, Beaverton, OR (US);
Matthew V. Metz, Hillsboro, OR (US);
Suman Datta, Beaverton, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/964,464

(22) Filed: Oct. 12, 2004

(65) Prior Publication Data
US 2006/0079005 A1      Apr. 13, 2006

(51) Int. Cl.
*H01L 21/31*     (2006.01)
*H01L 21/469*    (2006.01)

(52) U.S. Cl. ............... 438/762; 438/769; 438/785; 438/786; 257/E33.06; 257/E31.119; 257/E23.077

(58) Field of Classification Search ........... 438/762, 438/769, 785, 786, FOR. 395, FOR. 403
See application file for complete search history.

(56) References Cited

U.S. PATENT DOCUMENTS

| | | | |
|---|---|---|---|
| 3,933,541 A * | 1/1976 | Hagino et al. ......... 438/133 |
| 4,933,307 A | 6/1990 | Marshall et al. | |
| 6,063,698 A | 5/2000 | Tseng et al. ............. 438/585 |
| 6,184,072 B1 | 2/2001 | Kaushik et al. ......... 438/197 |
| 6,255,698 B1 | 7/2001 | Gardner et al. ......... 257/369 |
| 6,365,450 B1 | 4/2002 | Kim ......................... 438/216 |
| 6,410,376 B1 | 6/2002 | Ng et al. ................. 438/199 |
| 6,420,279 B1 | 7/2002 | Ono et al. ............... 438/785 |
| 6,475,874 B2 | 11/2002 | Xiang et al. ............. 438/396 |
| 6,514,828 B2 | 2/2003 | Ahn et al. ............... 438/240 |
| 6,544,906 B2 | 4/2003 | Rotondaro et al. ..... 438/785 |
| 6,586,288 B2 | 7/2003 | Kim et al. ............... 438/183 |
| 6,617,209 B1 | 9/2003 | Chau et al. ............. 438/240 |
| 6,617,210 B1 | 9/2003 | Chau et al. ............. 438/240 |
| 6,620,713 B2 | 9/2003 | Arghavani et al. ...... 438/585 |
| 6,689,675 B1 | 2/2004 | Parker et al. ............ 438/585 |
| 6,696,327 B1 | 2/2004 | Brask et al. ............. 438/197 |
| 6,696,345 B2 | 2/2004 | Chau et al. ............. 438/387 |
| 6,709,911 B1 | 3/2004 | Doczy et al. ........... 438/197 |
| 6,713,358 B1 | 3/2004 | Chau et al. ............. 438/287 |
| 6,716,707 B1 | 4/2004 | Brask et al. ............. 438/287 |

(Continued)

FOREIGN PATENT DOCUMENTS

EP      0 899 784 A2     3/1999

(Continued)

OTHER PUBLICATIONS

Polishchuk et al., "Dual Workfunction CMOS Gate Technology Based on Metal Interdiffusion", www.eesc.berkeley.edu, 1 page.

(Continued)

*Primary Examiner*—Michelle Estrada

(57) ABSTRACT

A method for making a semiconductor device is described. That method comprises converting a hydrophobic surface of a substrate into a hydrophilic surface, and forming a high-k gate dielectric layer on the hydrophilic surface.

19 Claims, 1 Drawing Sheet

U.S. PATENT DOCUMENTS

| | | | |
|---|---|---|---|
| 6,716,771 B2 * | 4/2004 | Buehler et al. | 438/783 |
| 6,746,967 B2 | 6/2004 | Brask et al. | 438/752 |
| 6,770,568 B2 | 8/2004 | Brask et al. | 438/746 |
| 6,787,440 B2 | 9/2004 | Parker et al. | 438/591 |
| 2002/0058374 A1 | 5/2002 | Kim et al. | 438/228 |
| 2002/0086504 A1 | 7/2002 | Park et al. | 438/580 |
| 2002/0197790 A1 | 12/2002 | Kizilyalli et al. | 438/240 |
| 2003/0032303 A1 | 2/2003 | Yu et al. | 438/770 |
| 2003/0045080 A1 | 3/2003 | Visokay et al. | 438/591 |
| 2004/0038538 A1 * | 2/2004 | Ho et al. | 438/694 |
| 2004/0082125 A1 * | 4/2004 | Hou et al. | 438/240 |
| 2005/0280081 A1 * | 12/2005 | Isaacson et al. | 257/335 |
| 2006/0071275 A1 * | 4/2006 | Brask et al. | 257/350 |

FOREIGN PATENT DOCUMENTS

GB    2 358 737 A    4/2001

OTHER PUBLICATIONS

Doug Barlage et al., "High-Frequency Response of 100nm Integrated CMOS Transistors with High-K Gate Dielectrics", 2001 IEEE, 4 pages.

Lu et al., "Dual-Metal Gate Technology for Deep-Submicron CMOS Devices", dated Apr. 29, 2003, 1 page.

Schwantes et al., "Performance Improvement of Metal Gate CMOS Technologies with Gigabit Feature Sizes", Technical University of Hanburg-Harburg, 5 pages.

* cited by examiner

US 7,384,880 B2

METHOD FOR MAKING A SEMICONDUCTOR DEVICE HAVING A HIGH-K GATE DIELECTRIC

FIELD OF THE INVENTION

The present invention relates to methods for making semiconductor devices, in particular, those that include high-k gate dielectric layers.

BACKGROUND OF THE INVENTION

MOS field-effect transistors with very thin silicon dioxide based gate dielectrics may experience unacceptable gate leakage currents. Forming the gate dielectric from certain high-k dielectric materials, instead of silicon dioxide, can reduce gate leakage. When forming such a dielectric on a hydrophobic surface, it may be necessary to form a buffer layer (e.g., a thin layer of silicon dioxide or silicon oxynitride) on that surface prior to forming the dielectric on the buffer layer. The presence of a buffer layer between the substrate and the high-k dielectric may contribute to the overall electrical thickness of the gate/gate dielectric stack. As device gate lengths shrink (e.g., to lengths that are significantly less than 45 nm), it may be desirable to decrease that electrical thickness—which may be done by eliminating such a buffer layer.

Accordingly, there is a need for an improved process for making a semiconductor device that includes a high-k gate dielectric. There is a need for a process for forming such a device that does not include forming the high-k gate dielectric on a buffer layer that is formed on an underlying substrate. The method of the present invention provides such a process.

Features shown in these figures are not intended to be drawn to scale.

DETAILED DESCRIPTION OF THE PRESENT INVENTION

A method for making a semiconductor device is described. That method comprises converting a hydrophobic surface of a substrate into a hydrophilic surface, and forming a high-k gate dielectric layer on the hydrophilic surface. In the following description, a number of details are set forth to provide a thorough understanding of the present invention. It will be apparent to those skilled in the art, however, that the invention may be practiced in many ways other than those expressly described here. The invention is thus not limited by the specific details disclosed below.

Figure 1A:
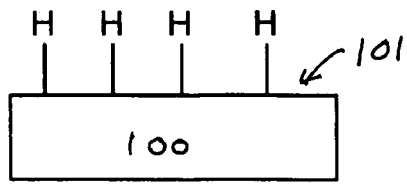
FIGS. 1a-1e represent cross-sections of structures that may be formed when carrying out an embodiment of the method of the present invention.

FIGS. 1a-1e represent cross-sections of structures that may be formed when carrying out an embodiment of the method of the present invention. FIG. 1a represents substrate 100, which includes hydrophobic surface 101. Substrate 100 may comprise any material that may serve as a foundation upon which a semiconductor device may be built. Substrate 100 may, for example, comprise silicon and/or germanium.

When substrate 100 comprises a silicon wafer, hydrophobic surface 101 may be formed on silicon containing substrate 100 by exposing silicon containing substrate 100 to a reducing agent, e.g., a reducing agent that comprises hydrogen. In a preferred embodiment, silicon containing substrate 100 is exposed to a 1% hydrofluoric acid solution for about 60 seconds to generate hydrophobic surface 101. It is believed that exposing silicon containing substrate 100 to such a solution will etch away any native oxide and subsequently cause hydrogen atoms to bond to its surface (as FIG. 1a indicates), yielding a surface that is hydrophobic.

Figure 1B:
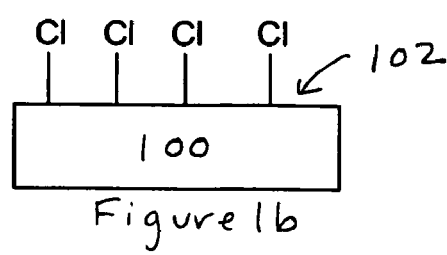
Figure 1C:
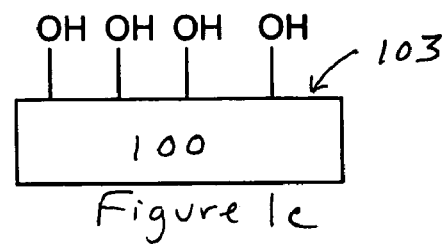

After forming hydrophobic surface 101 on silicon containing substrate 100, hydrophobic surface 101 is converted into a hydrophilic surface. In the illustrated embodiment, hydrophobic surface 101 is first converted into intermediate surface 102 (as FIG. 1b illustrates), which is then converted into hydrophilic surface 103 (as FIG. 1c illustrates). Hydrophobic surface 101 may, for example, be converted into intermediate surface 102 by exposing hydrophobic surface 101 to a halogen containing gas or a halide containing solution, e.g., chlorine or bromine gas, hydrobromic or hydrochloric acid, or a plasma derived at least in part from bromine or chlorine.

When hydrophobic surface 101 is exposed to chlorine, that surface may be exposed to a 2% solution of hydrochloric acid in deionized water. Alternatively, hydrophobic surface 101 may be treated with chlorine gas while being exposed to ultraviolet light. Appropriate conditions for converting hydrophobic surface 101 into intermediate surface 102 using these materials will be apparent to those skilled in the art. It is believed that exposing hydrophobic surface 101 to such a chlorine based solution or gas will cause chlorine atoms to replace hydrogen atoms that are located on the surface of substrate 100, yielding an intermediate surface that may react with steam, e.g., the chlorine covered surface that FIG. 1b represents.

In this embodiment, after forming intermediate surface 102, that surface is converted into hydrophilic surface 103 by exposing it to steam. In a preferred embodiment, the structure that FIG. 1c illustrates may be generated by exposing intermediate surface 102 to gas phase water at about 350° C. It is believed that exposing intermediate surface 102 to steam at that temperature will cause hydroxyl groups to replace chlorine atoms that are located on the surface of substrate 100, yielding the monohydroxylated surface shown in FIG. 1c.

It is further believed that the presence of chlorine atoms on intermediate surface 102 inhibits consumption (e.g., oxidation) of underlying substrate 100, which may otherwise occur when a surface like hydrophobic surface 101 is converted directly to hydrophilic surface 103 without forming intermediate surface 102, e.g., by treating hydrophobic surface 101 with an aqueous solution that contains hydrogen peroxide. Furthermore, hydrophobic surface 101 will not sufficiently convert to the desired hydrophilic surface 103 if merely exposed to steam. In a typical process, exposing hydrophobic surface 101 to a hydrogen peroxide solution may generate a buffer layer that is between about 3 and about 6 angstroms thick. Although a few examples of processes for converting hydrophobic surface 101 into hydrophilic surface 103 are described here, other processes for performing that conversion may be used instead, as will be apparent to those skilled in the art.

Figure 1D:
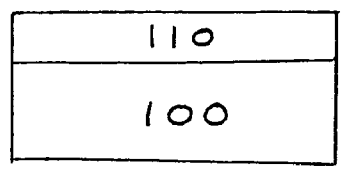

After generating bufferless surface 103, high-k gate dielectric layer 110 may be formed on that hydrophilic surface, generating the FIG. 1d structure. High-k gate dielectric layer 110 may comprise, for example, hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Particularly preferred are hafnium oxide, zirconium oxide, and aluminum oxide. Although a few examples of materials that may be used to form dielectric layer 110 are described here, that layer may be made from other materials that serve to reduce gate leakage.

High-k gate dielectric layer 110 may be formed on substrate 100 using a conventional deposition method, e.g., a conventional chemical vapor deposition ("CVD"), low pressure CVD, or physical vapor deposition process. Preferably, a conventional atomic layer CVD process is used. In such a process, a metal oxide precursor (e.g., a metal chloride) and steam may be fed at selected flow rates into a CVD reactor, which is then operated at a selected temperature and pressure to generate an atomically smooth interface between substrate 100 and dielectric layer 110. The CVD reactor should be operated long enough to form a layer with the desired thickness. In most applications, dielectric layer 110 should be less than about 60 angstroms thick, and more preferably between about 5 angstroms and about 40 angstroms thick.

After high-k gate dielectric layer 110 is deposited, it may be desirable to remove impurities from high-k gate dielectric layer 110 and to increase that layer's oxygen content. After removing impurities and increasing the oxygen content, metal gate electrodes 115 and 120 may be formed on the resulting high-k gate dielectric layer 110, to generate the structure of FIG. 1e. Various techniques for generating that structure will be apparent to those skilled in the art.

Metal gate electrodes 115 and 120 may comprise any conductive material from which metal gate electrodes may be derived. Metal gate electrode 115 may comprise an NMOS metal gate electrode, while metal gate electrode 120 comprises a PMOS metal gate electrode. Alternatively, metal gate electrode 115 may comprise a PMOS metal gate electrode, while metal gate electrode 120 comprises an NMOS metal gate electrode. Materials that may be used to form n-type metal gate electrodes include: hafnium, zirconium, titanium, tantalum, aluminum, their alloys (e.g., metal carbides that include these elements, i.e., hafnium carbide, zirconium carbide, titanium carbide, tantalum carbide, and aluminum carbide), and aluminides (e.g., an aluminide that comprises hafnium, zirconium, titanium, tantalum, or tungsten). Materials for forming p-type metal gate electrodes include: ruthenium, palladium, platinum, cobalt, nickel, and conductive metal oxides, e.g., ruthenium oxide.

Figure 1E:
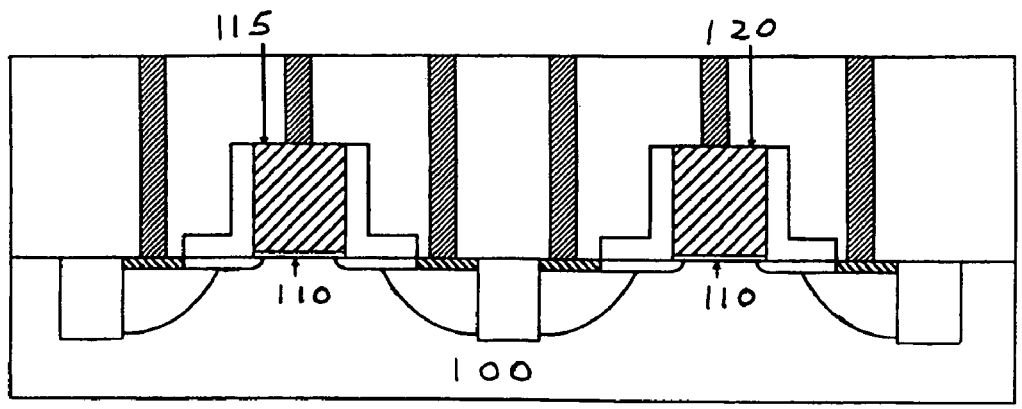

Metal NMOS gate electrodes preferably have a workfunction that is between about 3.9 eV and about 4.2 eV. Metal PMOS gate electrodes preferably have a workfunction that is between about 4.9 eV and about 5.2 eV. Although FIG. 1e represents structures in which the metal gate electrodes consist essentially of a homogeneous metal layer, in alternative embodiments, the n-type or p-type metal layers may generate only the lower part of the metal gate electrodes, with the remainder of the metal gate electrodes comprising another metal or metals, e.g., a metal that may be easily polished like tungsten, aluminum, titanium, or titanium nitride. Although a few examples of materials for forming metal gate electrodes 115 and 120 are identified here, those metal gate electrodes may be made from many other materials, as will be apparent to those skilled in the art. Moreover, although gate electrodes 115 and 120 preferably are metal gate electrodes, they may alternatively comprise polysilicon or a silicide.

The method of the present invention may enable a high-k gate dielectric layer to be formed directly on a hydrophilic surface of a substrate (e.g., a silicon containing substrate) without a buffer layer being present between the high-k gate dielectric layer and the hydrophilic surface. By enabling such a high-k gate dielectric layer to be formed on such a bufferless surface, it may be possible to substantially reduce the electrical thickness of a gate/gate dielectric stack that includes such a dielectric layer, which may facilitate high volume manufacture of devices with gate lengths of about 30 nm or less.

Although the foregoing description has specified certain steps and materials that may be used in the method of the present invention, those skilled in the art will appreciate that many modifications and substitutions may be made. Accordingly, all such modifications, substitutions and additions fall within the spirit and scope of the invention as defined by the appended claims.

What is claimed is:

1. A method for making a semiconductor device comprising:
   converting a hydrophobic surface of a substrate into a hydrophilic surface, wherein the hydrophobic surface is converted into the hydrophilic surface by first converting the hydrophobic surface into an intermediate surface by exposing the hydrophobic surface to chlorine, then converting the intermediate surface into the hydrophilic surface; and
   forming a high-k gate dielectric layer on the hydrophilic surface.

2. The method of claim 1 wherein the intermediate surface is converted into the hydrophilic surface by exposing the intermediate surface to steam.

3. The method of claim 1 wherein the high-k gate dielectric layer comprises a material that is selected from the group consisting of hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate.

4. A method for making a semiconductor device comprising:
   exposing a silicon containing substrate to hydrogen to generate a hydrophobic surface on the silicon containing substrate;
   exposing the hydrophobic surface to chlorine to generate an intermediate surface on the silicon containing substrate;
   exposing the intermediate surface to steam to generate a hydrophilic surface on the silicon containing substrate, and
   forming a high-k gate dielectric layer on the hydrophilic surface of the silicon containing substrate.

5. The method of claim 4 further comprising forming a metal gate electrode on the high-k gate dielectric layer.

6. The method of claim 4 wherein the silicon containing substrate is exposed to hydrofluoric acid to generate the hydrophobic surface on the silicon containing substrate.

7. The method of claim 4 wherein the hydrophobic surface is exposed to hydrochloric acid to generate the intermediate surface.

8. The method of claim 4 wherein the hydrophobic surface is exposed to chlorine gas and to ultraviolet light to generate the intermediate surface.

9. A method for making a semiconductor device comprising:
   exposing a silicon containing substrate to hydrofluoric acid to generate a hydrophobic surface on the silicon containing substrate;
   exposing the hydrophobic surface to chlorine to generate an intermediate surface on the silicon containing substrate that may react with steam;
   exposing the intermediate surface to steam to generate a hydrophilic surface on the silicon containing substrate, and forming a high-k gate dielectric layer on the hydrophilic surface of the silicon containing substrate, the high-k gate dielectric layer being formed directly on the hydrophilic surface without a buffer layer being present between the high-k gate dielectric layer and the hydrophilic surface.

10. The method of claim 9 further comprising forming a metal gate electrode on the high-k gate dielectric layer and wherein the high-k gate dielectric layer comprises a material that is selected from the group consisting of hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate.

11. The method of claim 9 wherein the hydrophobic surface is exposed to hydrochloric acid to generate the intermediate surface.

12. The method of claim 9 wherein the hydrophobic surface is exposed to chlorine gas and to ultraviolet light to generate the intermediate surface.

13. A method for making a semiconductor device comprising:
converting a hydrophobic surface of a substrate into a hydrophilic surface using a hydrofluoric acid, a halogen, and steam; and
forming a high-k gate dielectric layer on the hydrophilic surface.

14. The method of claim 13, wherein the halogen comprises a halogen containing gas.

15. The method of claim 14, wherein the halogen containing gas comprises chlorine gas or bromine gas.

16. The method of claim 13. wherein the halogen comprises a halide containing solution.

17. The method of claim 16, wherein the halide containing solution comprises hydrochloric acid or hydrobromic acid.

18. The method of claim 1 wherein the substrate comprises silicon and further comprising forming a hydrophobic surface on the silicon containing substrate by exposing the silicon containing substrate to a reducing agent.

19. The method of claim 18 wherein the reducing agent comprises hydrogen.

* * * * *